United States Patent
Tsai et al.

(10) Patent No.: US 6,544,868 B2
(45) Date of Patent: Apr. 8, 2003

(54) METHOD OF MANUFACTURING LIGHT EMITTING DIODE WITH LOW-RECEPTIVITY P-TYPE IMPURITY LAYERS FORMED BY MICROWAVE TREATMENT

(75) Inventors: Tzong-Liang Tsai, Hsinchu (TW); Chung-Ying Chang, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/131,136

(22) Filed: Apr. 25, 2002

(65) Prior Publication Data

US 2002/0119587 A1 Aug. 29, 2002

Related U.S. Application Data

(62) Division of application No. 09/497,316, filed on Feb. 3, 2000, now Pat. No. 6,429,102.

(30) Foreign Application Priority Data

Jan. 27, 2000 (TW) .......................... 89101337

(51) Int. Cl.[7] .......................... H01L 21/20; H01L 21/36
(52) U.S. Cl. .......................... 438/483; 438/499; 438/535; 438/542
(58) Field of Search .......................... 438/483, 492, 438/493, 499, 501, 503, 505, 507, 509, 535, 542

(56) References Cited

U.S. PATENT DOCUMENTS

| | | | |
|---|---|---|---|
| 4,303,455 A | | 12/1981 | Splinter et al. |
| 5,306,662 A | | 4/1994 | Nakamura et al. |
| 5,395,794 A | * | 3/1995 | Sklyarevich et al. ........ 438/535 |
| 6,177,292 B1 | * | 1/2001 | Hong et al. ................... 438/46 |

FOREIGN PATENT DOCUMENTS

GB 2 164 796 A 3/1986

OTHER PUBLICATIONS

Belyaev, "Effect of Microwave Radiation on the Physico-chemical Properties of Some Semiconductor Materials (GaAs, GaP, InP) and Heterostructures, as well as on the Parameters of Surface–Barrier Diode Structures".*
Proceedings of the Semiconductor Conference, 1999 International, vol. 1, p. 385 (1999).*
G.R. Antell, A.T.R. Briggs, S.A. Kitching & J.P. Stagg; Passivation of Zinc Acceptors in InP by Atomic Hydrogen Coming From Arsine During Metalorganic Vapor Phase Epitaxy: Applied Physics Letters, Aug. 20, 1988.
S. Cole, J.S. Evans, M.J. Harlow, A.W. Nelson & S. Wong; Effect of Cooling Ambient on Electrical Activation of Dopants in Movpe of InP; Electronics Letters, Jul. 21, 1988.
Amano et al; P–Type Condition in Mg–Doped GaN Treated with Low–Energy Electron Beam Irradiation (LEEBI); Japanese Journal of Applied Physics, vol. 28. No. 12, Dec. 1989.

(List continued on next page.)

*Primary Examiner*—Kamand Cuneo
*Assistant Examiner*—Asok Kumar Sarkar
(74) *Attorney, Agent, or Firm*—Nixon Peabody LLP; Donald R. Studebaker

(57) ABSTRACT

The present invention provides a method of manufacturing a low resistivity p-type compound semiconductor material over a substrate. The method of the present invention comprises the steps of forming a p-type impurity doped compound semiconductor layer on the substrate by either HVPE, OMVPE or MBE and applying a microwave treatment over the p-type impurity doped compound semiconductor layer for a period of time. The high resistivity p-type impurity doped compound semiconductor layer is converted into a low resistivity p-type compound semiconductor material according to the present invention.

54 Claims, 6 Drawing Sheets

OTHER PUBLICATIONS

Hamada et al; AlGaInP Visable Laser Diodes Grown on Misoriented Substrates; IEEE Journal of Quantum Electronics, vol. 27, No. 6, Jun. 6, 1991.

S.J. Pearton; *Ion Beam Processing and Rapid Thermal Annealing of InP And Related Compounds*; Second International Conference, Indium Phosphide and Related Materials, Jan. 29, 1991.

* cited by examiner

METHOD OF MANUFACTURING LIGHT EMITTING DIODE WITH LOW-RECEPTIVITY P-TYPE IMPURITY LAYERS FORMED BY MICROWAVE TREATMENT

CROSS-REFERENCE TO RELATED APPLICATIONS

This application is a divisional of application Ser. No. 09/497,316, filed Feb. 3, 2000, which is now U.S. Pat. No. 6,429,102.

BACKGROUND OF THE INVENTION

1. Field of the Invention

The present invention relates to a method of manufacturing a compound semiconductor material, and more particularly, to a method of manufacturing a low resistivity p-type compound semiconductor material.

2. Description of the Prior Art

Most of the semiconductor devices such as light emitting diode, laser diode, photodetector, and transitior normally need some layers doped with n-type dopants and some layers doped with p-type dopants. However, some III–V and II–VI compound semiconductor materials are difficult to dope the p-type impurity in high carrier concentration, or even can't achieve p-type conductivity. For example, p-type InP, AlGaInP and AlGaInN III–V compound semiconductor materials and ZeSSe II–VI compound semiconductor materials are some typical examples that are either difficult to achieve high p-type conductivity or even impossible to get the p-type conductivity. One of the major reasons why it is difficult to achieve high earner concentration in these p-type doping materials is attributed to the unintentional hydrogen incorporation and resulting acceptor passivation which occurs during the epitaxial growth or after the cool-down process of growth.

The influence of the cooling ambiance on the passivation of Zn acceptors in InP grown by atmospheric-pressure OMVPE was first studied by Antell et al. [Appl. Phys. Lett., 53, (1988), 758] and Cole et al. [Electron. Lett., 24, (1988), 929]. They found that the p-type InP layer capped with a p-type InGaAs and cooled down in an $AsH_3$ ambiance, the hole carrier concentration could be significantly reduced by about 80% compared to a Zn-doped InP layer with a n-type cap layer. The hole carrier concentration can be recovered to the expected value simply by annealing in nitrogen atmosphere.

The hydrogen passivation is.even more serious in a p-type AlGaInP material, especially in a high aluminum content AlGaInP material. Hamada et al. [IEEE J. Quantum Electron. 27, (1991), 1483] found that the degree of passivation increased with aluminum composition. An increase in hole carrier concentration after annealing at 500 degree centigrade was observed and proved by a decrease in hydrogen content using SIMS analysis.

The hydrogen passivation effect is the most serious issue in AlGaInN materials. It causes the AlGaInN materials failed to achieve p-type conductivity. Amano et al. [Japanese J. Appl. Phys. 28, (1989), L2112] used low energy electron beam irradiation (LEEBI) to convert the compensated Mg-doped GaN into conductive p-type material. However, with acceleration voltage of 5 kV–15 kV, an electron beam can only reach a depth of about 0.5 μm. In device design, normally a p-type GaN material with a thickness of more than 0.5 μm is necessary. Therefore, LEEBI is not an effective way to convert the thick high resistivity Mg-doped GaN material into p-type conducting material. Besides, the conversion of the p-type GaN material is achieved by scanning the electron beam across the whole wafer. This electron beam scanning method is a quite slow process. It is very difficult to be adapted into the mass production process by the electron beam scanning method.

In U.S. Pat. No. 5,306,662, Nakamura et al. disclosed a method for reducing the resistivity of the p-type GaN by an annealing process in a nitrogen atmosphere over 400 degree centigrade approximately. But to be more effective, the annealing process should be carried out in the temperature range of 600–1200 degree centigrade.. Therefore, it is not suitable for III–V compound semiconductor materials that have high dissociation pressure at low temperature without a protective cap layer.

SUMMARY OF THE INVENTION

It is therefore a primary objection of the present invention to provide a method of manufacturing a low resistivity p-type compound semiconductor material to solve the above mentioned problem.

According to the first aspect of the present invention, there is provided a method of manufacturing a low resistivity p-type compound semiconductor material over a substrate. The method of the present invention comprises the steps of:

forming a p-type impurity doped III–V compound semiconductor layer on the substrate; and applying a microwave treatment over the p-type impurity doped III–V compound semiconductor layer.

According to the second aspect of the present invention, there is provided a method of manufacturing a low resistivity p-type compound semiconductor material over a substrate. The method of the present invention comprises the steps of:

forming a p-type impurity doped II–VI compound semiconductor layer on the substrate; and applying a microwave treatment over the p-type impurity doped II–VI compound semiconductor layer.

According to the third aspect of the present invention, there is provided a method of manufacturing a light emitting diode. The light emitting diode comprises a substrate, a n-type lower cladding formed on the substrate, and an active layer formed on the n-type lower cladding layer. The method of the present invention comprises the steps of:

forming an p-type impurity doped upper cladding layer on the active layer; and applying a microwave treatment over the p-type impurity doped upper cladding layer.

According to the fourth aspect of the present invention, there is provided a method of manufacturing a light emitting diode. The light emitting diode comprises a substrate. The method of the present invention comprises the steps of:

forming an p-type impurity doped lower cladding layer on the substrate;

applying a microwave treatment over the p-type impurity doped lower cladding layer;

forming an active layer on the p-type impurity doped lower cladding layer; and forming an n-type upper layer on the active layer.

The present invention provides a simple and effective way to convert the high resistivity p-type impurity doped III–V or II–VI compound semiconductor materials into conductive p-type materials. According to the present invention, the p-type impurity doped III–V or II–VI compound semiconductor materials are grown by either hydride vapor phase epitaxy (HVPE), organometallic vapor phase epitaxy (OMVPE), or molecular beam epitaxy (MBE). The p-type impurity doped III–V or II–VI compound semiconductor materials normally have high resistivity due to hydrogen passivation effect. The high resistivity p-type impurity doped III–V or II–VI compound semiconductor materials are then treated in a microwave apparatus for a period of time in order to convert them into high conductive p-type materials.

These and other objectives of the present invention will no doubt become obvious to those of ordinary skill in the art after reading the following detailed description of the preferred embodiment which is illustrated in the various figures and drawings.

BRIEF DESCRIPTION OF THE DRAWINGS

FIG. 2(*b*) is a carrier concentration versus activate time diagram of the Mg-doped GaN layer shown in FIG. 1.

DETAILED DESCRIPTION OF THE PREFERRED EMBODIMENT

The present invention is to provide an easy and effective method of manufacturing a low resistivity p-type compound semiconductor material. According to the method of the present invention, first of all, a p-type impurity doped compound semiconductor layer is grown either directly or indirectly on a substrate by either HVPE, OMVPE or MBE. For III–V compound semiconductor material, the p-type impurity doped compound semiconductor layer can be an $Al_xGa_yIn_{1-x-y}P$ (where $0 \leq x \leq 1$, $0 \leq y \leq 1-x$) layer or an AlGaInN layer. The p-type dopant can be an element chosen from the group consisting of Zn, Cd, Be, Mg, Ca, and Ba. For II–VI compound semiconductor material, the p-type impurity doped compound semiconductor layer can be a ZnSSe layer. The p-type dopant can be an element chosen from the group consisting of Li, Na, K, N, P, and O. Due to the hydrogen passivation effect, the p-type impurity doped compound semiconductor layer will have a lower hole carrier concentration or even very high resistivity. Secondly, the substrate is pre-heated to a temperature that is below 400 degree centigrade to prevent the p-type impurity doped compound semiconductor layer cracking. The purpose of maintaining the substrate at a temperature above room temperature and below 400 degree centigrade is to pre-heat the substrate and to prevent the cracking of the substrate during the microwave treatment. Because the microwave treatment is a very low temperature process, it can be applied not only for $Al_xGa_yIn_{1-x-y}N$ (where $0 \leq x \leq 1$, $0 \leq y \leq 1-x$) material but also for InP, AlGaInP and ZnSe materials which have high dissociation pressure at low temperature. The pre-heating of the substrate can be preformed by a resistance heating process or an infrared lamp heating process. Besides, in the present invention, the p-type impurity doped compound semiconductor material also can be pre-heated at a temperature above 400 degree centigrade. Finally, the p-type impurity doped compound semiconductor layer is applied by a microwave treatment in a microwave apparatus which also has the resistance heating function. The p-type impurity doped compound semiconductor layer is then treated in a microwave apparatus for a period of time and converted into a low resistivity p-type compound semiconductor material.

The present invention will herein be described in detail with reference to the following embodiments and their accompanying drawing.

Embodiment 1

Figure 1:
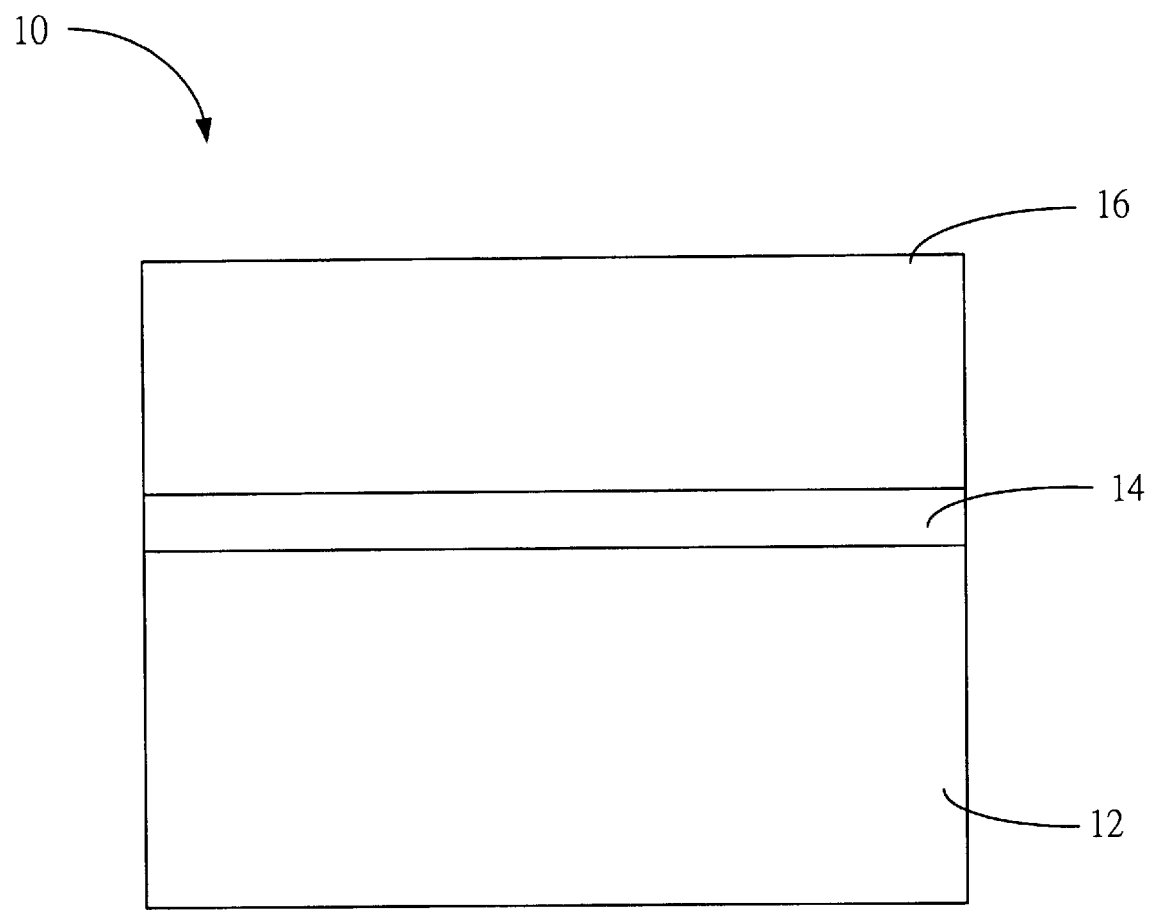
FIG. 1 is a schematic diagram of a test structure according to the present invention.

Please refer to FIG. 1. FIG. 1 is a schematic diagram of an as-grown sample 10 according to the present invention. An epitaxy-ready sapphire substrate 12 is loaded into the OMVPE reactor chamber (not shown). The a sapphire substrate 12 is preheated for 10 min at 1150 degree centigrade. The temperature of the sapphire substrate 12 is then lowered to about 500–600 degree centigrade. At a temperature of 520 degree centigrade, a 25 nm thick GaN buffer layer 14 is grown on the sapphire substrate 12. The temperature is again raised to 1100 degree centigrade and a 4 μm thick Mg-doped GaN layer 16 is grown on the buffer layer 14 with a growth rate about 2 μm/hr.

Figure 2A:
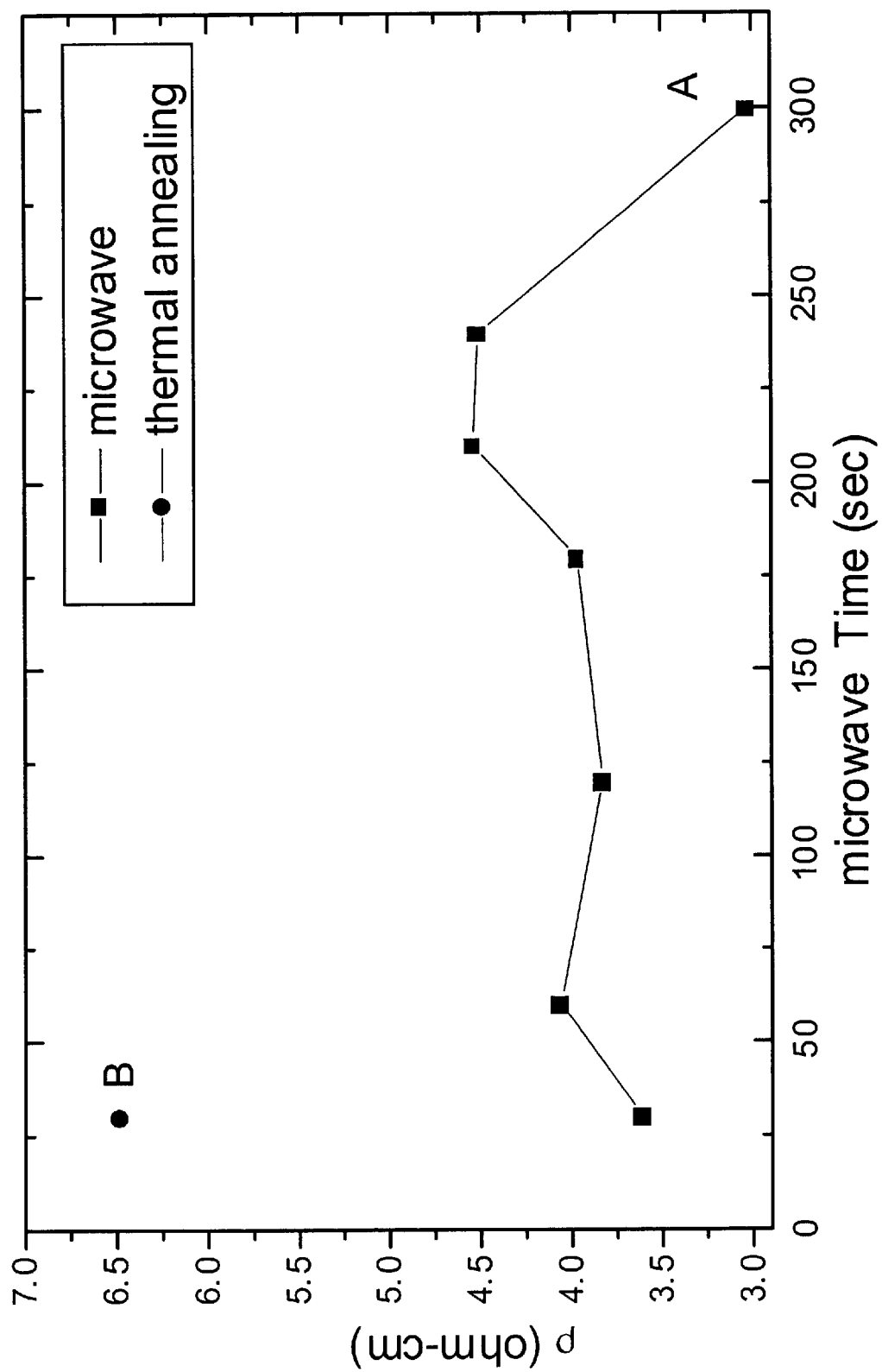
FIG. 2(*a*) is a resistivity versus activate time diagram of the Mg-doped GaN layer shown in FIG. 1.
Figure 2B:
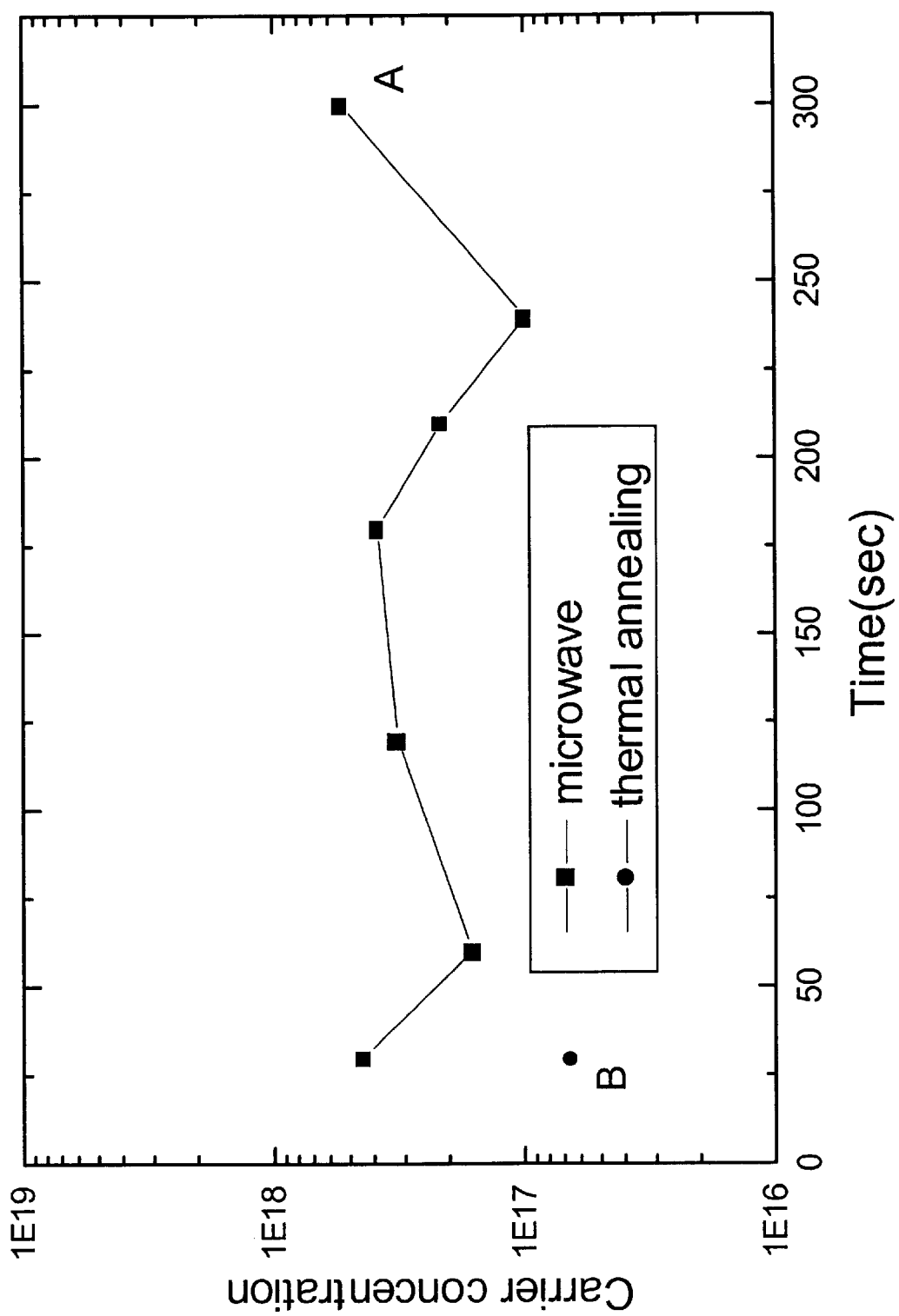

FIG. 2(*a*) is a resistivity versus activate time diagram of the Mg-doped GaN layer 16 shown in FIG. 1. The as-grown sample 10 is then put into a microwave apparatus (not shown) which also has the resistance heating function. First, the as-grown sample 10 is pre-heated at a temperature about 60 degree centigrade to homogenize the temperature distribution across the whole wafer 10. After that, a 2.45 GHz microwave with output power of 560 W is applied to the Mg-doped GaN layer 16 for 5 min to activate the p-type dopants. The corresponding resistivity of the Mg-doped GaN layer 16 with microwave treatment is shown as the point A of the FIG. 2(*a*). For comparison, a Mg-doped GaN sample (not shown) with the same growth conditions is annealed at a temperature of 730 degree centigrade for 20 min and the corresponding resistivity of the furnace annealed Mg-doped GaN sample is shown as the point B of the FIG. 2(*a*). The carrier concentration of the Mg-doped GaN layer 16 with microwave treatment is above $1 \times 10^{17}/cm^3$ by Hall measurement. The carrier concentration of the furnace annealed Mg-doped GaN sample is about $1 \times 10^{17}/cm^3$ and nearly smaller than the carrier concentration of Mg-doped GaN layer 16 with the microwave treatment, as comparing the point A and the point B shown in FIG. 2(*b*). Furthermore, as shown in FIG. 2(*a*) and FIG. 2(*b*), around 30 seconds for the microwave treatment upon the Mg-doped GaN layer 16 can also show the good result of small resistivity and high carrier concentration.

Figure 3:
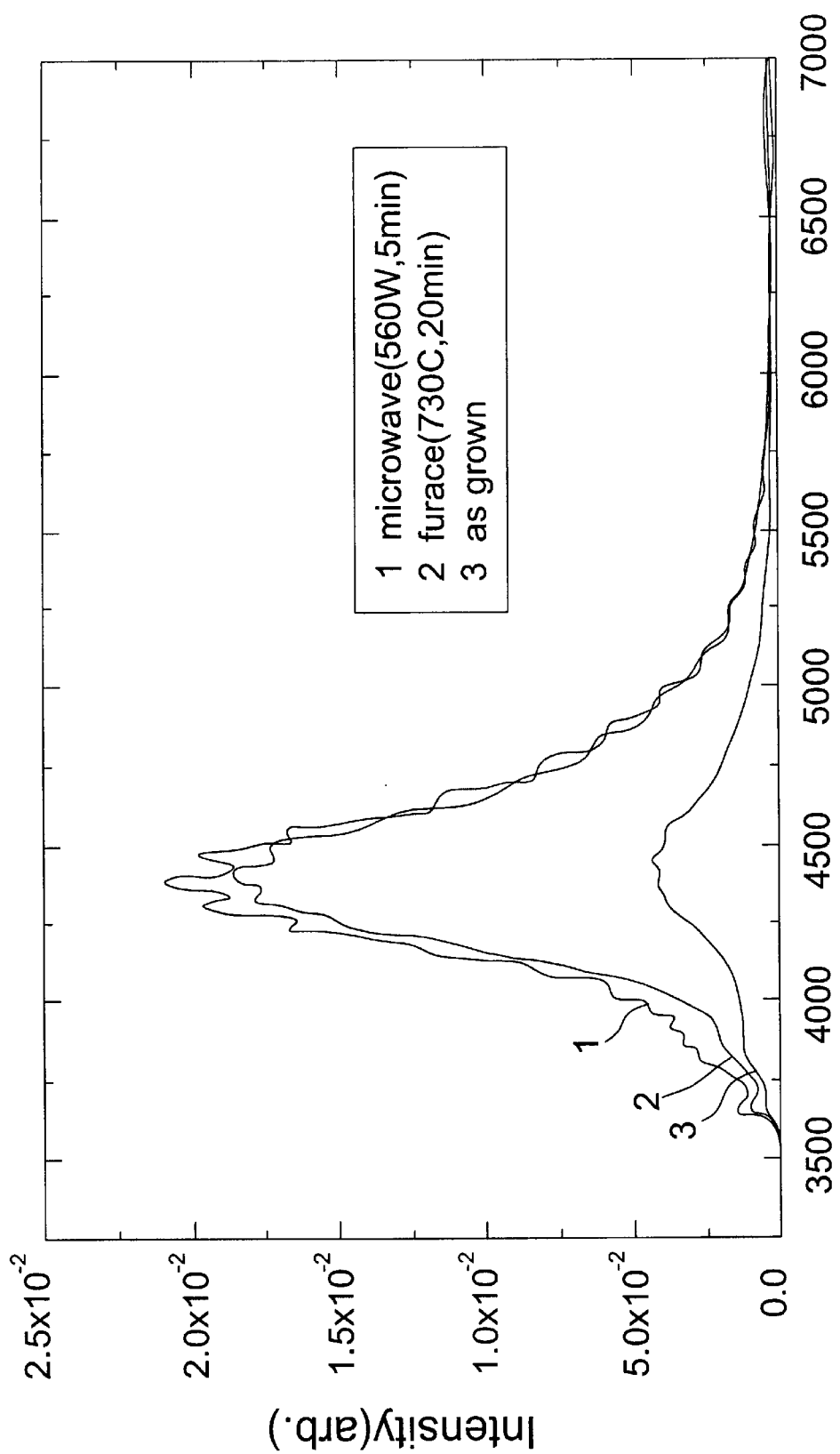
FIG. 3 is a diagram showing the photoluminescence spectrum of the Mg doped GaN (a) without any treatment, (b) with the resistance furnace annealing, (c) with the microwave treatment.

Please refer to FIG. 3. FIG. 3 is a diagram showing the photoluminescence spectrum of a Mg-doped GaN 16 (a) without any treatment, (b) with the resistance furnace annealing, (c) with the microwave treatment. The Mg-doped GaN layer 16 with the microwave treatment and the Mg-doped GaN layer sample with resistance furnace annealing both shows a strong 4375 angstrom blue peak compared with the as-grown sample without any treatment. From both Hall measurement and photoluminescence spectrum, it proves that the microwave treatment is as effective as the resistance furnace annealing in converting the high resistivity material into the high conductive p-type material.

Embodiment 2

Figure 4:
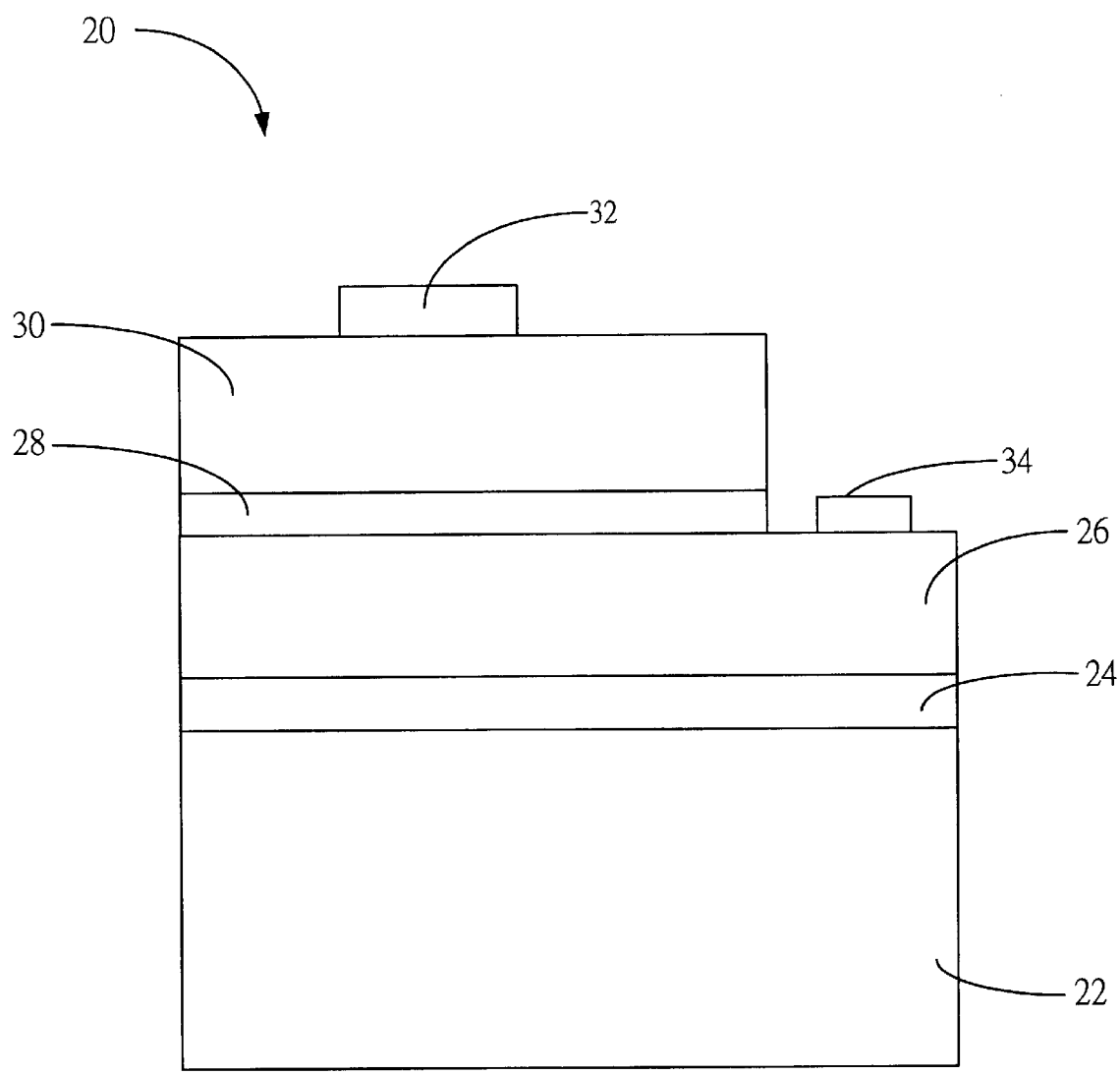
FIG. 4 is a schematic diagram of a light emitting diode according to the present invention.

Please refer to FIG. 4. FIG. 4 is a schematic diagram of a light emitting diode 20 according to the present invention. The present invention is also to provide a method of manufacturing a light emitting diode 20 with a sapphire substrate 22. A GaN buffer layer 24 is grown on the sapphire substrate 22. The sapphire substrate 22 is then heated to about 1130 degree centigrade. A 4 $\mu$m n-type Si-doped GaN layer 26 is grown on the buffer layer 24. The sapphire substrate 22 is then cooled down to about 820 degree centigrade. An InGaN/GaN multiple quantum well structure 28 is grown on the top of the n-type Si-doped GaN layer 26. Finally, a p-type Mg-doped GaN layer 30 is grown on the InGaN/GaN multiple quantum well structure 28 to form the light emitting diode 20. The light emitting diode 20 is then put into a microwave apparatus (not shown) that also has the resistance heating function. The light emitting diode 20 is pre-heated at a temperature of about 60 degree centigrade. After that, a 2.45 GHz microwave with output power of 560 W is applied to the light emitting diode 20 for 3 min to activate the p-type dopants.

Besides, the light emitting diode 20 with the microwave treatment is then processed into LED chips according to the following steps.

(1) The surface of the p-type GaN layer 30 is partially etched until the n-type GaN layer 26 is exposed.

(2) A Ni/Au ohmic contact metal 32 is evaporated onto the p-type GaN layer 30 and a Ti/Al ohmic contact metal 34 is deposited onto the n-type GaN layer 26.

(3) The metallized light emitting diode 20 is then scribed and broken into a square shape chip with a size of 350 $\mu$m×350 $\mu$m.

Finally, the LED chip fabricated as described above has a forward voltage about 3.5 volt and this forward voltage value is similar to the LED chips made with the furnace annealing.

Embodiment 3

Figure 5:
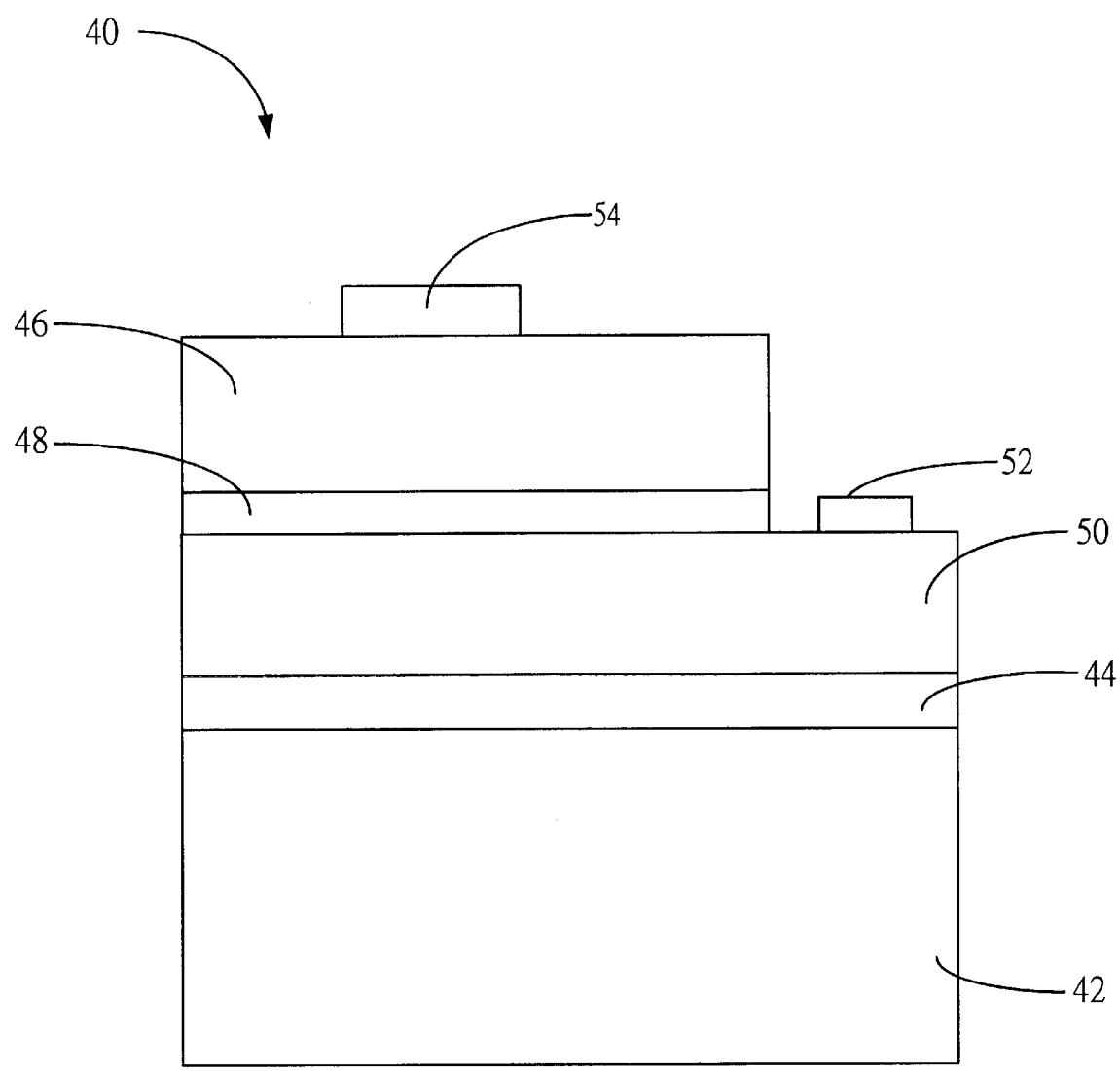
FIG. 5 is another schematic diagram of a light emitting diode according to the present invention.

Please refer to FIG. 5. FIG. 5 is another schematic diagram of a light emitting diode 40 according to the present invention. The present invention is also to provide a method of manufacturing a light emitting diode 40 with a sapphire substrate 42. A GaN buffer layer 44 is grown on the sapphire substrate 42. The sapphire substrate 42 is then heated to about 1120 degree centigrade. A 4 $\mu$m p-type Mg-doped GaN layer 50 is grown on the buffer layer 44. The p-type Mg-doped GaN layer 50 is then put into a microwave apparatus (not shown) that also has the resistance heating function. The sapphire substrate 42 is pre-heated at a temperature of about 60 degree centigrade. After that, a 2.45 GHz microwave with output power of 560 W is applied to the p-type Mg-doped GaN layer 50 for 3 min to activate the p-type dopants. And then, the sapphire substrate 42 is then cooled down to about 820 degree centigrade. An INGaN/GaN multiple quantum well structure 48 is grown on the top of the p-type Mg-doped GaN layer 50. The sapphire substrate 42 is then heated to about 1130 degree centigrade. A n-type Si-doped GaN layer 46 is grown on the InGaN/GaN multiple quantum well structure 48 to form the light emitting diode 40.

Besides, the light emitting diode 40 with the microwave treatment is then processed into LED chips according to the following steps.

(1) The surface of the n-type GaN layer 46 is partially etched until the p-type GaN layer 50 is exposed.

(2) A Ni/Au ohmic contact metal 52 is evaporated onto the p-type GaN layer 50 and a Ti/Al ohmic contact metal 54 is deposited onto the n-type GaN layer 46.

(3) The metallized light emitting diode 40 is then scribed and broken into a square shape chip with a size of 350 $\mu$m×350 $\mu$m.

Finally, the LED chip fabricated as described above has a forward voltage about 3.5 volt and this forward voltage value is similar to the LED chips made with the furnace annealing.

Embodiment 4

The present invention is also to provide a method of manufacturing a light emitting diode 40 with a sapphire substrate 42. A GaN buffer layer 44 is grown on the sapphire substrate 42. The sapphire substrate 42 is then heated to about 1120 degree centigrade. A 4 $\mu$m p-type Mg-doped GaN layer 50 is grown on the buffer layer 44. And then, the sapphire substrate 42 is then cooled down to about 820 degree centigrade. An INGaN/GaN multiple quantum well structure 48 is grown on the top of the p-type Mg-doped GaN layer 50. The sapphire substrate 42 is then heated to about 1130 degree centigrade. A n-type Si-doped GaN layer 46 is grown on the InGaN/GaN multiple quantum well structure 48 to form the light emitting diode 40. The p-type Mg-doped GaN layer 50 is then put into a microwave apparatus (not shown) that also has the resistance heating function. The sapphire substrate 42 is pre-heated at a temperature of about 60 degree centigrade. After that, a 2.45 GHz microwave with output power of 560 W is applied to the p-type Mg-doped GaN layer 50 for 3 min to activate the p-type dopants.

Besides, the light emitting diode 40 with the microwave treatment is then processed into LED chips according to the following steps.

(1) The surface of the n-type GaN layer 46 is partially etched until the p-type GaN layer 50 is exposed.

(2) A Ni/Au ohmic contact metal 52 is evaporated onto the p-type GaN layer 50 and a Ti/Al ohmic contact metal 54 is deposited onto the n-type GaN layer 46.

(3) The metallized light emitting diode 40 is then scribed and broken into a square shape chip with a size of 350 $\mu$m×350 $\mu$m.

Finally, the LED chip fabricated as described above has a forward voltage about 3.5 volt and this forward voltage value is similar to the LED chips made with the furnace annealing.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of manufacturing a light emitting diode, the light emitting diode comprising a substrate, a lower cladding layer of a first conductivity type formed on the substrate, and an active layer formed on the lower cladding layer, the method comprising the steps of:

(a) forming an upper cladding layer of a second conductivity type on the active layer, the upper cladding layer having a complex formed by a second conductivity type dopant and a hydrogen; and (b) applying a microwave treatment over the upper cladding layer such that the hydrogen escapes from said complex due to absorption of microwave energy of the complex and the second conductivity type dopant restores ability of an acceptor.

2. The method of claim 1 wherein the first conductivity type is a n-type, and the second conductivity type is a p-type.

3. The method of the claim 2 wherein the method further comprises, between the step (a) and step (b), a step (c) of pre-heating the substrate at a predetermined range of temperature.

4. The method of the claim 3 wherein the predetermined range of temperature is below 400 degree centigrade.

5. The method of the claim 4 wherein the step (c) is performed by a resistance heating process.

6. The method of the claim 4 wherein the step (c) is performed by an infrared lamp heating process.

7. The method of the claim 1 wherein the step (a) is performed by a hydride vapor phase epitaxy process.

8. The method of the claim 1 wherein the step (a) is performed by an organometallic vapor phase epitaxy process.

9. The method of the claim 1 wherein the step (a) is performed by a molecular beam epitaxy process.

10. The method of the claim 1 wherein the upper cladding layer is an $Al_xGa_yIn_{1-x-y}P$ layer, and $0 \leq x \leq 1$, $0 \leq y \leq 1-x$.

11. The method of claim 10 wherein the upper cladding layer is doped by at least one selected from the group consisting of Zn, Cd, Be, Mg, Ca, and Ba.

12. The method of the claim 1 wherein the upper cladding layer is an $Al_xGa_yIn_{1-x-y}N$ layer, and $0 \leq x \leq 1$, $0 \leq y \leq 1-x$.

13. The method of claim 12 wherein the upper cladding layer is doped by at least one selected from the group consisting of Zn, Cd, Be, Mg, Ca, and Ba.

14. The method of claim 1 wherein the upper cladding layer is a ZnSSe layer.

15. The method of claim 14 wherein the upper cladding layer is doped by at least one selected from the group consisting of Li, Na, K, N, P, and O.

16. The method of claim 1 wherein the substrate is an epitaxy-ready sapphire substrate.

17. The method of claim 1 wherein the step (b) is performed by a 2.45 GHz microwave with output power of 560 W.

18. The method of claim 1 wherein the active layer is a multiple quantum well structure.

19. A method of manufacturing a light emitting diode, the light emitting diode comprising a substrate, the method comprising the steps of:
 (a) forming a lower cladding layer of a first conductivity type on the substrate, the lower cladding layer having a complex formed by a first conductivity type dopant and a hydrogen;
 (b) applying a microwave treatment over the lower cladding layer such that the hydrogen escapes from said complex due to absorption of microwave energy of the complex and the first conductivity type dopant restores ability of an acceptor;
 (c) forming an active layer on the lower cladding layer of the first conductivity type; and
 (d) forming an upper layer of a second conductivity type on the active layer.

20. The method of claim 19 wherein the first conductivity type is a p-type, and the second conductivity type is a n-type.

21. The method of the claim 20 wherein the method further comprises, between the step (a) and step (b), a step (e) of pre-heating the substrate at a predetermined range of temperature.

22. The method of the claim 21 wherein the predetermined range of temperature is below 400 degree centigrade.

23. The method of the claim 22 wherein the step (e) is performed by a resistance heating process.

24. The method of the claim 22 wherein the step (e) is performed by an infrared lamp heating process.

25. The method of the claim 19 wherein the step (a) is performed by a hydride vapor phase epitaxy process.

26. The method of the claim 19 wherein the step (a) is performed by an organometallic vapor phase epitaxy process.

27. The method of the claim 19 wherein the step (a) is performed by a molecular beam epitaxy process.

28. The method of the claim 19 wherein the lower cladding layer is an $Al_xGa_yIn_{1-x-y}P$ layer, and $0 \leq x \leq 1$, $0 \leq y \leq 1-x$.

29. The method of claim 28 wherein the lower cladding layer is doped by at least one selected from the group consisting of Zn, Cd, Be, Mg, Ca, and Ba.

30. The method of claim 19 wherein the lower cladding layer is an $Al_xGa_yIn_{1-x-y}N$ layer, and $0 \leq x \leq 1$, $0 \leq y \leq 1-x$.

31. The method of claim 30 wherein the lower cladding layer is doped by at least one selected from the group consisting of Zn, Cd, Be, Mg, Ca, and Ba.

32. The method of claim 19 wherein the lower cladding layer is a ZnSSe layer.

33. The method of claim 32 wherein the lower cladding layer is doped by at least one selected from the group consisting of Li, Na, K, N, P, and O.

34. The method of claim 19 wherein the substrate is an epitaxy-ready sapphire substrate.

35. The method of claim 19 wherein the step (b) is performed by a 2.45 GHz microwave with output power of 560 W.

36. The method of claim 19 wherein the active layer is a multiple quantum well structure.

37. A method of manufacturing a light emitting diode, the light emitting diode comprising a substrates the method comprising-the steps of:
 (a) forming a lower cladding layer of a first conductivity type on the substrate, the lower cladding layer having a complex formed by a first conductivity type dopant and a hydrogen;
 (b) forming an active layer on the lower cladding layer of the first conductivity type;
 (c) forming an upper layer of a second conductivity type on the active layer; and
 (d) applying a microwave treatment over the lower cladding layer such that the hydrogen escapes from said complex due to absorption of microwave energy of the complex and the first conductivity type dopant restores ability of an acceptor.

38. The method of claim 37 wherein the first conductivity type is a p-type, and the second conductivity type is a n-type.

39. The method of the claim 38 wherein the method further comprises, between the step (c) and step (d), a step (e) of pre-heating the substrate at a predetermined range of temperature.

40. The method of the claim 39 wherein the predetermined range of temperature is below 400 degree centigrade.

41. The method of the claim 40 wherein the step (e) is performed by a resistance heating process.

42. The method of the claim 40 wherein the step (e) is performed by an infrared lamp heating process.

43. The method of the claim 37 wherein the step (a) is performed by a hydride vapor phase epitaxy process.

44. The method of the claim 37 wherein the step (a) is performed by an organometallic vapor phase epitaxy process.

45. The method of the claim 37 wherein the step (a) is performed by a molecular beam epitaxy process.

46. The method of the claim 37 wherein the lower cladding layer is an $Al_xGa_yIn_{1-x-y}P$ layer, and $0 \leq x \leq 1$, $0 \leq y \leq 1-x$.

47. The method of claim 46 wherein the lower cladding layer is doped by at least one selected from the group consisting of Zn, Cd, Be, Mg, Ca, and Ba.

48. The method of claim 37 wherein the lower cladding layer is an $Al_xGa_yIn_{1-x-y}N$ layer, and $0 \leq x \leq 1$, $0 \leq y \leq 1-x$.

49. The method of claim 48, wherein the lower cladding layer is doped by at least one selected from the group consisting of Zn, Cd, Be, Mg, Ca, and Ba.

50. The method of claim 39 wherein the lower cladding layer is a ZnSSe layer.

51. The method of claim 50 wherein the lower cladding layer is doped by at least one selected from the group consisting of Li, Na, K, N, P, and O.

52. The method of claim 37 wherein the substrate is an epitaxy-ready sapphire substrate.

53. The method of claim 37 wherein the step (b) is performed by a 2.45 GHz microwave with output power of 560 W.

54. The method of claim 37 wherein the active layer is a multiple quantum well structure.

* * * * *

UNITED STATES PATENT AND TRADEMARK OFFICE
CERTIFICATE OF CORRECTION

PATENT NO. : 6,544,868 B2
APPLICATION NO. : 10/131136
DATED : April 8, 2003
INVENTOR(S) : Tzong-Liang Tsai and Chung-Ying Chang It is certified that error appears in the above-identified patent and that said Letters Patent is hereby corrected as shown below:

<u>Title page,</u>
Item [54], Title, delete "METHOD OF MANUFACTURING LIGHT EMITTING DIODE WITH LOW-RECEPTIVITY-P-TYPE IMPURITY LAYERS FORMED BY MICROWAVE TREATMENT" and replace with -- METHOD OF MANUFACTURING LIGHT EMITTING DIODE WITH LOW-RESISTIVITY P-TYPE IMPURITY LAYERS FORMED BY MICROWAVE TREATMENT --.

Signed and Sealed this

Fourth Day of July, 2006

JON W. DUDAS
*Director of the United States Patent and Trademark Office*